United States Patent [19]

Sakamoto

[11] 4,271,434
[45] Jun. 2, 1981

[54] CHANNEL SELECTOR

[75] Inventor: Yoichi Sakamoto, Takatsuki, Japan

[73] Assignee: Matsushita Electric Industrial Co., Ltd., Osaka, Japan

[21] Appl. No.: 37,332

[22] Filed: May 9, 1979

[30] Foreign Application Priority Data

May 17, 1978 [JP] Japan .................................. 53/59220
Nov. 7, 1978 [JP] Japan ................................. 53/137574

[51] Int. Cl.³ .......................... H04N 5/44; H04B 1/34
[52] U.S. Cl. ................................ 358/193.1; 455/164; 455/169
[58] Field of Search ...................... 358/191, 193, 191.1, 358/193.1; 325/419, 420, 422, 423, 464, 465, 468–470; 455/182, 183, 164, 165, 167, 169

[56] References Cited

U.S. PATENT DOCUMENTS 4,109,283  8/1978  Rast ..................................... 358/191

Primary Examiner—John C. Martin
Attorney, Agent, or Firm—Wenderoth, Lind & Ponack

[57] ABSTRACT

A channel selector for a radio frequency receiver system including a phase locked loop frequency synthesizer for synthesizing a local oscillator frequency corresponding to a closely determined frequency to a transmitted signal of a desired receiving channel, a closed loop search tuning system for varying the local oscillation frequency to provide an automatic frequency control operation of the channel selector, and a control system for enabling either the phase locked loop frequency synthesizer or the closed loop search tuning system to operate so as to control the local oscillation frequency in dependence upon the presence or absence of a received transmitted signal.

8 Claims, 21 Drawing Figures

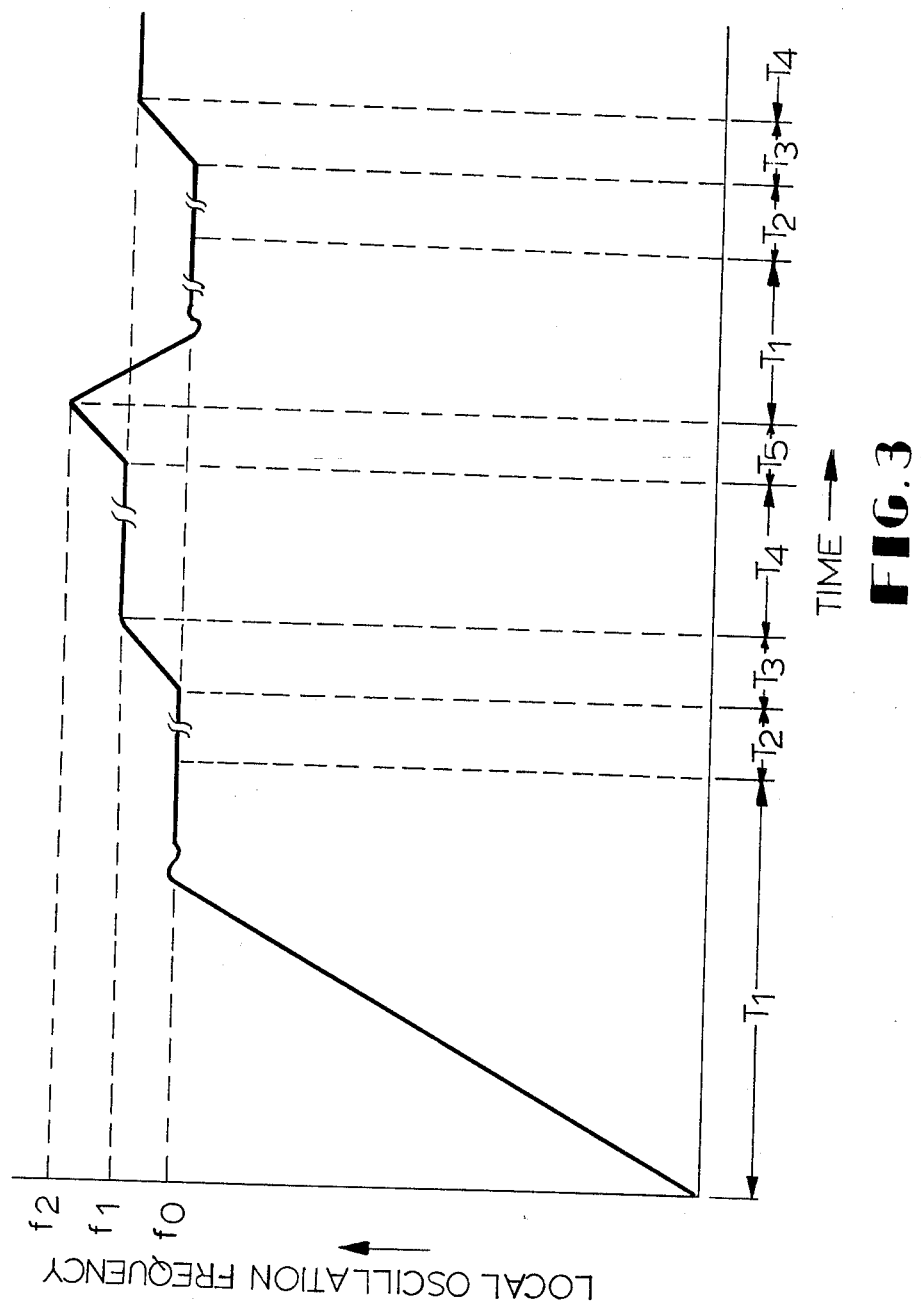

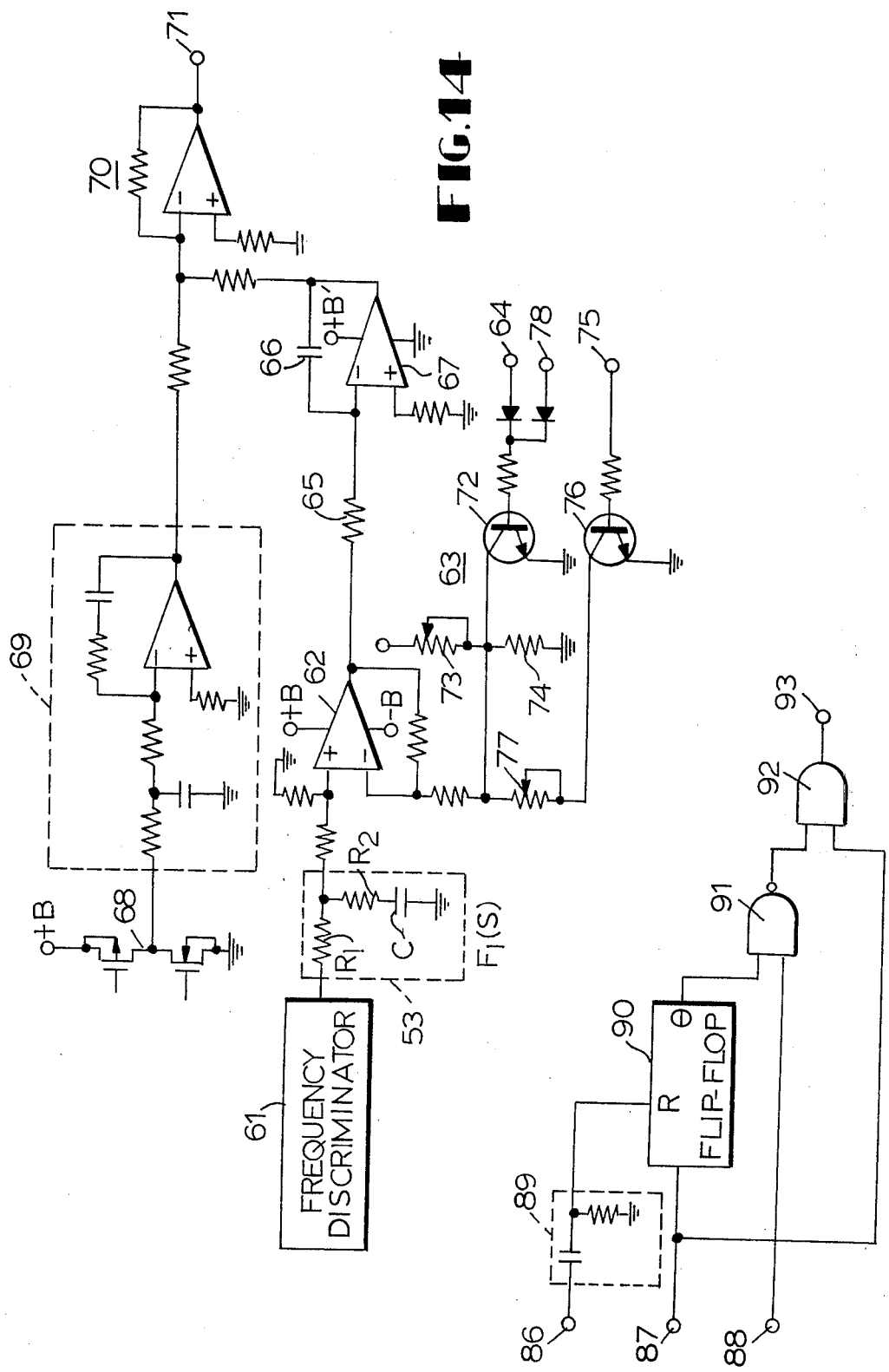

CHANNEL SELECTOR

BACKGROUND OF THE INVENTION

This invention relates to a channel selector for use in receivers such as television receivers.

Conventional phase locked loop (PLL) frequency synthesizer channel selectors have problems such as frequency hunting in the automatic fine tuning (AFT) mode and digital noise interference. In order to solve such problems, in the present invention, a PLL frequency synthesizer establishes a closely determined frequency to the transmitting frequency of a desired receiving channel, and from this frequency a search tuning system searches the transmitting frequency, and after completion of the search operation, a receiving system is interchanged from the PLL frequency synthesizer to the search tuning system.

BRIEF DESCRIPTION OF THE DRAWINGS

Details of this invention will be described hereinafter with reference to the accompanying drawings, in which:

FIG. 3 is a diagram for explaining the operation of the channel selector;

FIG. 14 is a circuit diagram showing a practical form of the connection of the PLL system and the search tuning system according to the third embodiment; and FIG. 15 is a diagram showing a logic operator usable in the third embodiment.

SUMMARY OF THE INVENTION

Figure 1:
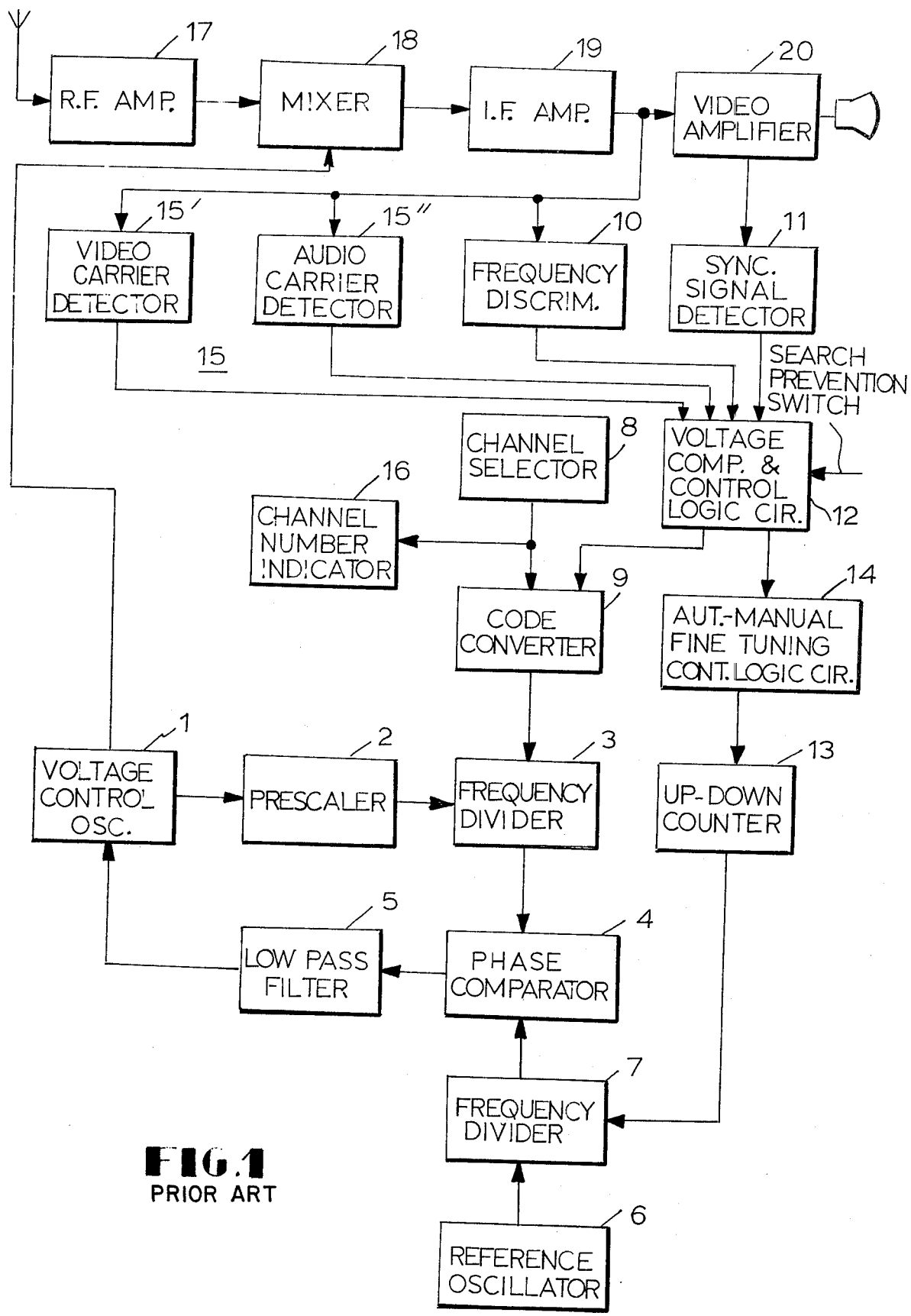
FIG. 1 is a block diagram of the PLL frequency synthesizer channel selector according to the prior art.

An example of conventional television channel selectors using a PLL frequency synthesizer is shown in FIG. 1. The PLL frequency synthesizer has a loop consisting of a voltage controlled local oscillator 1, a prescaler 2, a programmable frequency divider 3, a phase comparator 4 and a low pass filter 5. The output of a reference oscillator 6 is divided by a programmable frequency divider 7 which is programmed at a standard dividing ratio. The divider 7 output is provided at one input terminal of a phase comparator 4. An output of the programmable divider 3, the dividing ratio of which is determined by the output code of a code converter 9 which is controlled by a channel selecting apparatus 8, is provided at the second input terminal of the phase comparator 4.

In the case of the automatic fine tuning (AFT) mode, the outputs of a frequency discriminator 10 and a vertical synchronous signal detector 11 are compared with the reference voltages in comparators in block 12, and the outputs of the comparators are logically operated upon in a control logic circuit contained within the same block 12. The AFT is effected by controlling the counting direction and contents of an up-down counter 13 so that the dividing ratio of the programmable counter 7 varies according to the information obtained from the frequency discriminator 10 and the vertical sync. detector 11.

Manual fine tuning (MFT) is carried out by controlling the counting direction and contents of the up/down counter 13 according to the output of an automatic manual fine tuning control logic circuit 14.

For the signal seek operation, a verification signal is needed to verify whether a received signal is a correct television broadcast signal or not. In order to obtain this verification signal, the outputs of carrier detector 15 consisting of a video carrier detector 15' and a sound carrier detector 15", output of a frequency discriminator 10 and output of a vertical sync. signal detector 11 are compared by the comparators within block 12, and the outputs of the comparators are logically operated upon. The verification signal controls the address of the code converter 9 and enables the signal seeking of a broadcasting channel.

Other designations in FIG. 1 are as follows. Index 16 is a channel number indicator, 17 is a radio frequency amplifier, 18 is a mixer, 19 is an intermediate frequency amplifier and 20 is a video amplifier.

The detailed description of such a prior art system, especially for AFT operation, is disclosed, e.g., in U.S. Pat. No. 4,025,953.

However, in the configuration shown in FIG. 1, because of discrete variations of the reference input frequency inputted into the phase comparator 4, frequency hunting tends to occur if special considerations are not taken in selecting the circuits or circuit parameters. One step of the discrete variation of the reference input frequency mentioned above causes a different step variation of the local oscillating frequency depending on the selected channel, because control sensitivities of the voltage controlled oscillator vary according to the selected channel. Therefore, in the present case of using a broad frequency band such as the television broadcast band, the discrete steps of fine adjustment of the tuning frequency have a wide range of values, making system design difficult.

Moreover, because of the use of digital PLL, considerations with respect to digital noise interference are necessary. Even if such considerations are made, it is difficult to completely eliminate the digital noise. Furthermore, the prior art example uses the output of the audio carrier detector 15" in addition to the video carrier detector 15', the frequency discriminator 10 and the vertical sync. signal detector 11 to verify the correct tuning of the video carrier. But the output of the audio carrier detector has a small signal-to-noise ratio in low received input signal situations and it is therefore difficult to verify the correct tuning.

The present invention is intended to eliminate the disadvantages of the prior art mentioned above.

It is an object of the present invention to solve the problem of frequency hunting.

It is another object of the present invention to solve the problem of the discrete steps of fine adjustment of the tuning frequency having a wide range of values.

It is still another object of the present invention to solve the problem of the digital noise interference.

It is a yet another object of the present invention to remove the audio carrier detector.

DESCRIPTION OF THE PREFERRED EMBODIMENT

Figure 2:
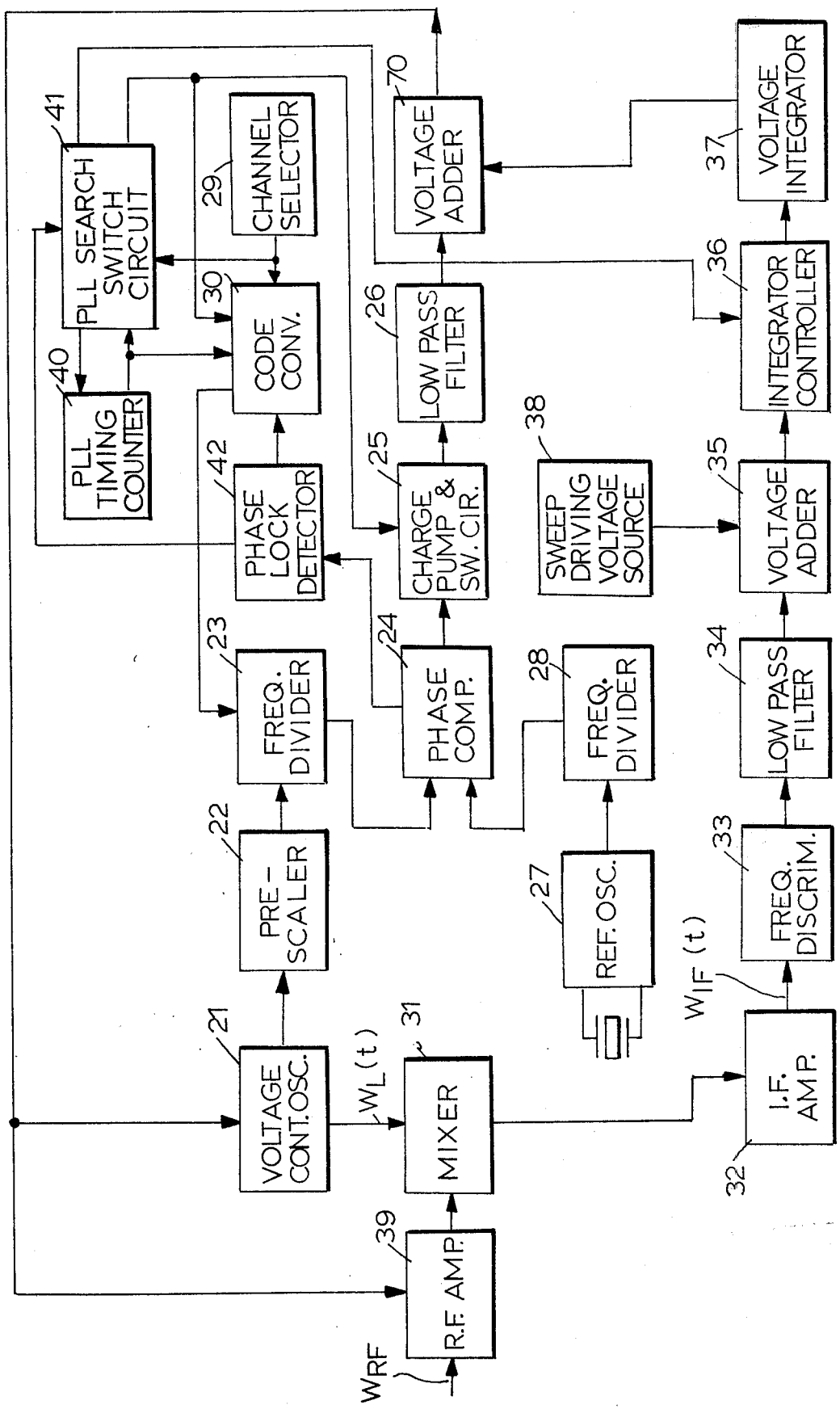
FIG. 2 is a block diagram of the channel selector according to a first embodiment of the present invention.

FIG. 2 shows a block diagram of the first embodiment of the present invention. A PLL frequency synthesizer has a loop consisting of a voltage controlled local oscillator 21, a prescaler 22, a programmable frequency divider 23, a phase comparator 24, a charge-pump and 3-state-switch circuits 25, a low pass filter 26 and a voltage adder 70 and has a configuration wherein an output of a reference oscillator 27 is divided by a reference frequency divider 28 and is applied to an input terminal of the phase comparator 24, and an output of the programmable frequency divider 23, the dividing ratio of which is determined by the output code of a code converter 30 which is controlled by a channel selecting apparatus (channel selector) 29, is applied to the other input terminal of the phase comparator 24.

On the other hand, a search tuning system has a loop consisting of the local voltage controlled oscillator 21, a mixer 31, an intermediate frequency amplifier 32, a frequency discriminator 33, a low pass filter 34, a voltage adder 35, a voltage integrator controller 36, a voltage integrator 37 and a voltage adder 70 and has a configuration wherein the output voltage of sweep driving voltage source 38 is applied to the voltage adder 35, and the output of a radio frequency amplifier 39 is applied to the mixer 31.

A PLL timing counter 40 is for counting the time $T_1$ shown in FIG. 3 which determines the period when only the PLL is closed. A PLL-search switch circuit 41 is controlled by the output of a channel selecting apparatus 29, the output of a phase lock detector 42 or the output of the PLL timing counter 40 and controls the charge-pump and 3-state switch circuits 25 and the voltage-integrator controller 36. The switch circuit 41 enables the charge pump and switch circuit 25 which charges or pumps the capacitor of the low pass filter 26 and causes the PLL to be closed during the time $T_1$. It keeps the PLL closed during time $T_2$ also. On the other hand, the voltage-integrator controller 36 keeps the output of the voltage integrator 37 at a sweep starting reference voltage during the time $T_1$, and keeps the same at a sweeping state during the time $T_2$.

Just after the end of the time $T_2$, the PLL-search switch circuit 41 controls the charge-pump and 3-state switch circuits 25 and causes the input terminal of the low pass filter 26 to be at floating state. That is, it makes the PLL open loop. The switch circuit 41 controls the voltage-integrator controller 36 to keep the search tuning system closed loop after the end of the time $T_2$, that is, during a time $T_3$.

Referring to FIGS. 4 (a) and (b), operation of the PLL during the time $T_2$ is explained as follows. During this time, the PLL is in a locked state, and a sweeping voltage $\dot{V}n(s) = \Delta\dot{v}/(s^2)$ is added to this loop as a disturbing noise as shown in FIG. 4 (a). Here, $\Delta\dot{v}$ is the voltage sweeping rate of the output of the voltage integrator 37, s is a Laplace complex variable, $\theta i(s)$ is the reference input phase of a phase comparator 43, Kd is the sensitivity of the phase comparator 43, F(s) is the transfer function of a low pass filter 44, $K_0$ is the sensitivity of a voltage controlled oscillator 45 and $\theta_0(s)$ is the output phase of the oscillator 45. If $$\Delta\omega = K_0 \times \Delta v \tag{1}$$

FIG. 4 (a) may be transformed to FIG. 4 (b), that is, a disturbing phase $\theta n = \Delta\dot{\omega}/(s^3)$ is added to the reference input phase $\theta i(s)$ of a phase comparator 46. The phase comparator 46, low pass filter 47 and voltage controlled oscillator 48 have the same characteristics as those of elements 43, 44 and 45, respectively.

If the output of $\theta e(s)$ of the phase comparator 46 is $$\theta e(s) = \theta i(s) - \theta_0(s) \tag{2}$$

from FIG. 4 (b)

$$\theta e(s) = \frac{s[\theta_i(s) + \{\Delta\dot{\omega}/(s^3)\}]}{s + K_0 k_d F(s)} \tag{3}$$

and the steady-state frequency error $$\theta_e = \lim_{t \to \infty} \frac{d\theta_e(t)}{dt}$$

is obtained by the final value theorem.

$$\lim_{t \to \infty} \frac{d\theta_e(t)}{dt} = \lim_{s \to 0} s[s\theta_e(s)] \tag{4}$$

$$= \lim_{s \to 0} s^2 \left[ \frac{s\{\theta i(s) + \frac{\Delta\dot{\omega}}{s}\}}{s + K_0 K_d F(s)} \right]$$

$$= \frac{\Delta\dot{\omega}}{K_0 K_d F(0)}$$

$$= \frac{\Delta\dot{\omega}}{Kv}$$

where $Kv = K_0 K_d F(0)$. If an active filter is used as the low pass filter 47, Kv may be chosen to have a value large enough to make negligible the frequency error $$\lim_{t \to \infty} = \frac{d\theta_e(t)}{dt}.$$

In other words, the local oscillating frequency during the time $T_2$ shown in FIG. 3 is nearly equal to said frequency during the time $T_1$. The time of this $T_2$ continues until the input voltage of the voltage adder 70 from the voltage integrator 37 reaches the voltage corresponding to the frequency $f_0$ shown in FIG. 3.

If the frequency $f_0$ is the local oscillation frequency corresponding to a predetermined frequency close to a transmitting frequency of a desired receiving channel, the channel selector shown in FIG. 2 establishes said predetermined frequency and stands by to search the transmitting frequency from this frequency.

Figure 5A:
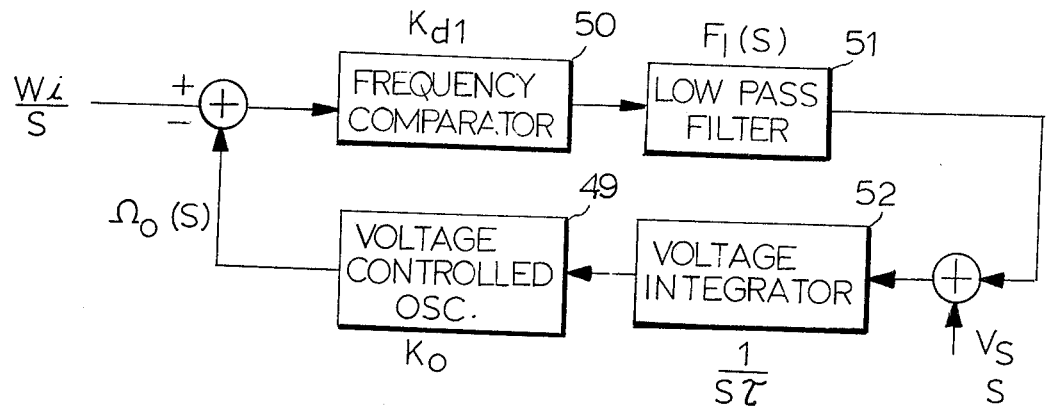
FIGS. 5 (a), (b) are block diagrams of the model of the search tuning system.

Referring to a model shown in FIGS. 5(a) and 5 (b) and a frequency-discriminator characteristic shown in FIG. 6, operation of the search tuning system during the time $T_3$ and $T_4$ shown in FIG. 3 is explained as follows.

Figure 5B:
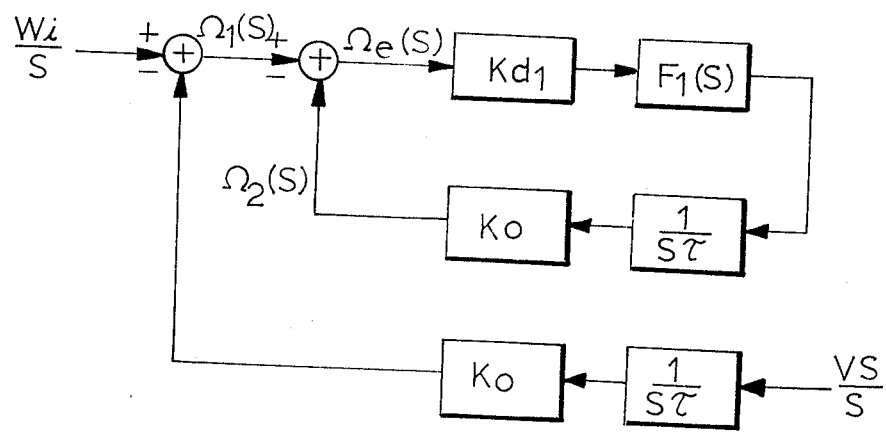

The difference $\omega_{IF}(t)$ between the local oscillation frequency $\omega L(t)$ and receiving frequency $\omega_{RF}$ shown in FIG. 2 is taken to be equivalent to the output $\omega_0(t)$ of the voltage controlled oscillator (VCO) 49 shown in FIG. 5 (a), where the Laplace transform of $\omega_0(t)$ is $\Omega_0(s)$. Correspondingly, the frequency discriminator 33 shown in FIG. 2 is represented by a frequency comparator 50 which indicates the frequency difference between a reference input frequency $\omega i/s$ and output $\Omega_0(s)$ of the VCO 49 in FIG. 5 (a).

In order to move the point, at which a sweep driving voltage $V_s/s$ in FIG. 5 (a) is applied to the system, to the reference input side of the search tuning system, an equivalent model shown in FIG. 5 (b) is derived. From FIG. 5 (b)

$$\Omega_e(s) = \frac{\omega_i \tau - (K_0 V_s/s)}{s\tau + K_0 K_{d1} F_1(s)} \quad (5)$$

where, $\omega i$ is a reference frequency determined on the characteristic of the frequency discriminator which has linear output characteristic with respect to frequency, $Kd_1$ is sensitivity of the frequency comparator 50, $F_1(s)$ is transfer function of a low pass filter 51 and $\tau$ is time constant of a voltage integrator 52.

From the final value theorem, steady-state-frequency error $\omega e$ is obtained as $$\omega_e = \lim_{t \to \infty} \omega_e(t) = \lim_{s \to 0} s \, \Omega_e(s) \quad (6)$$
$$= \lim_{s \to 0} \frac{s\omega_i \tau - K_0 V_s}{s\tau + K_0 K_{d1} F_1(s)}$$

Figure 8:
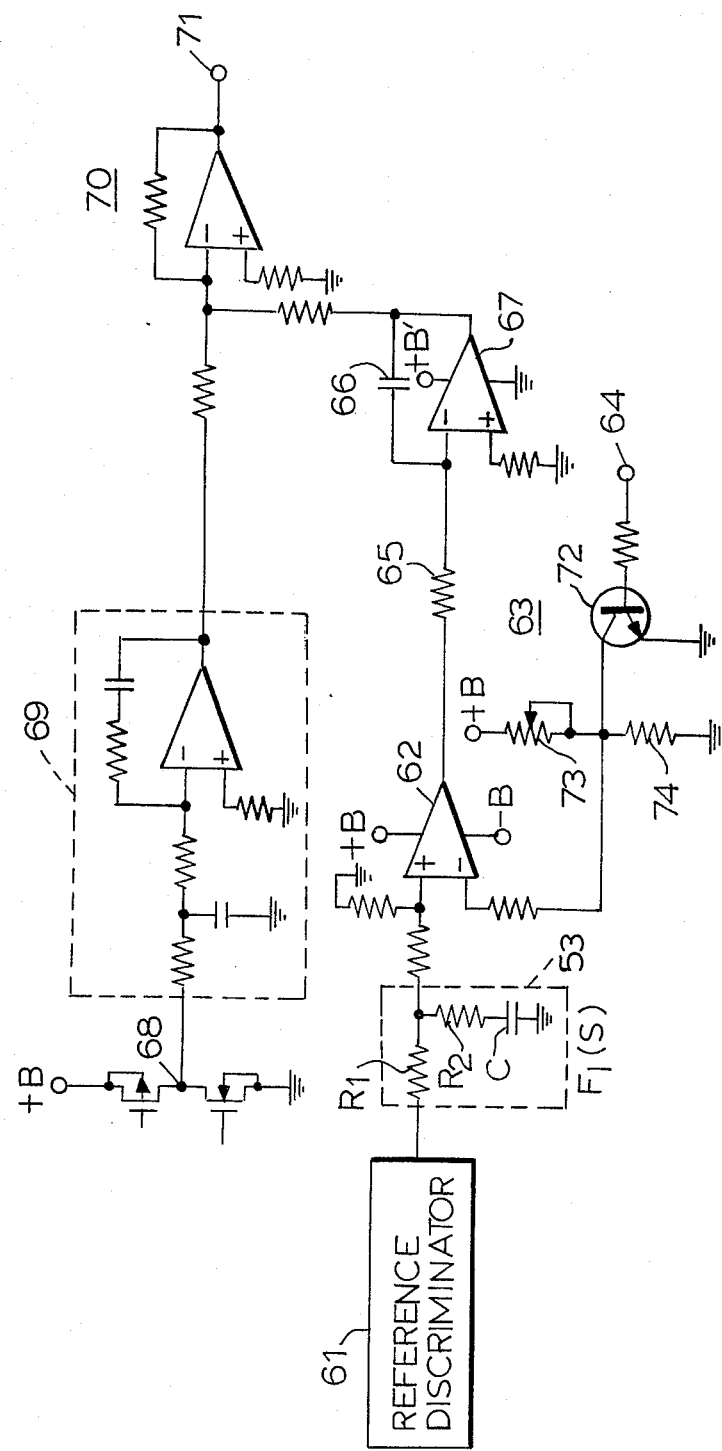
FIG. 8 is a circuit diagram showing a practical form of the connection of the PLL system and the search tuning system.

If a lag-lead filter 53 shown in FIG. 8 is used as the low pass filter, $$F_1(s) = \frac{s\tau_2 + 1}{s(\tau_1 + \tau_2) + 1} \quad (7)$$

where $\tau_1 = R_1 C$ and $\tau_2 = R_2 C$
In this case, from equation (6)

$$\omega e = V_s/Kd \quad (8)$$

This equation shows that the steady-state-frequency error is independent of the sensitivity $K_0$ of the VCO 49, therefore it shows that the error is independent of the sensitivity of the local oscillator 21. The equation also shows that by making the sweep driving voltage $V_s$ variable, the intermediate frequency is variable in the range of the frequency-lock range shown in FIG. 6. The former feature solves the problem of the prior art wherein one step of fine adjustment of the tuning frequency varies according to the receiving frequency, and the latter feature shows that manual fine adjustment of the tuning frequency can be done, under the condition that the frequency-lock range shown in FIG. 6 is wide enough.

During time period $T_4$, according to the operation mentioned above, the search tuning system tunes an arriving signal, or a receiving signal. Even if the arriving signal has an offset frequency to a nominal transmitting frequency, this system always follows the arriving signal. This operation corresponds to the AFT of the prior art. The problems of the frequency hunting in the AFT mode and digital noise interference of the prior art are solved, because the system is analogically controlled as described above.

If the reception of the transmitting signal is broken at a time corresponding to the right hand side of the time $T_4$ shown in FIG. 3, the outut frequency of the local oscillator 21 increases, and the system will be detuned, because the intermediate frequency signal disappears. Accordingly, even if the reception of the transmitted signal resumes, the receiving thereof cannot be effected.

In order to prevent this problem, in the configuration shown in FIG. 2, certain blocks are added so that output of a phase-lock detector 42 is obtained by using information from the phase comparator 24 to control the programmable divider 23 through the code converter 30 and to control the PLL-search switch circuit 41. Operation of this part is explained as follows using FIG. 7.

Figure 7:
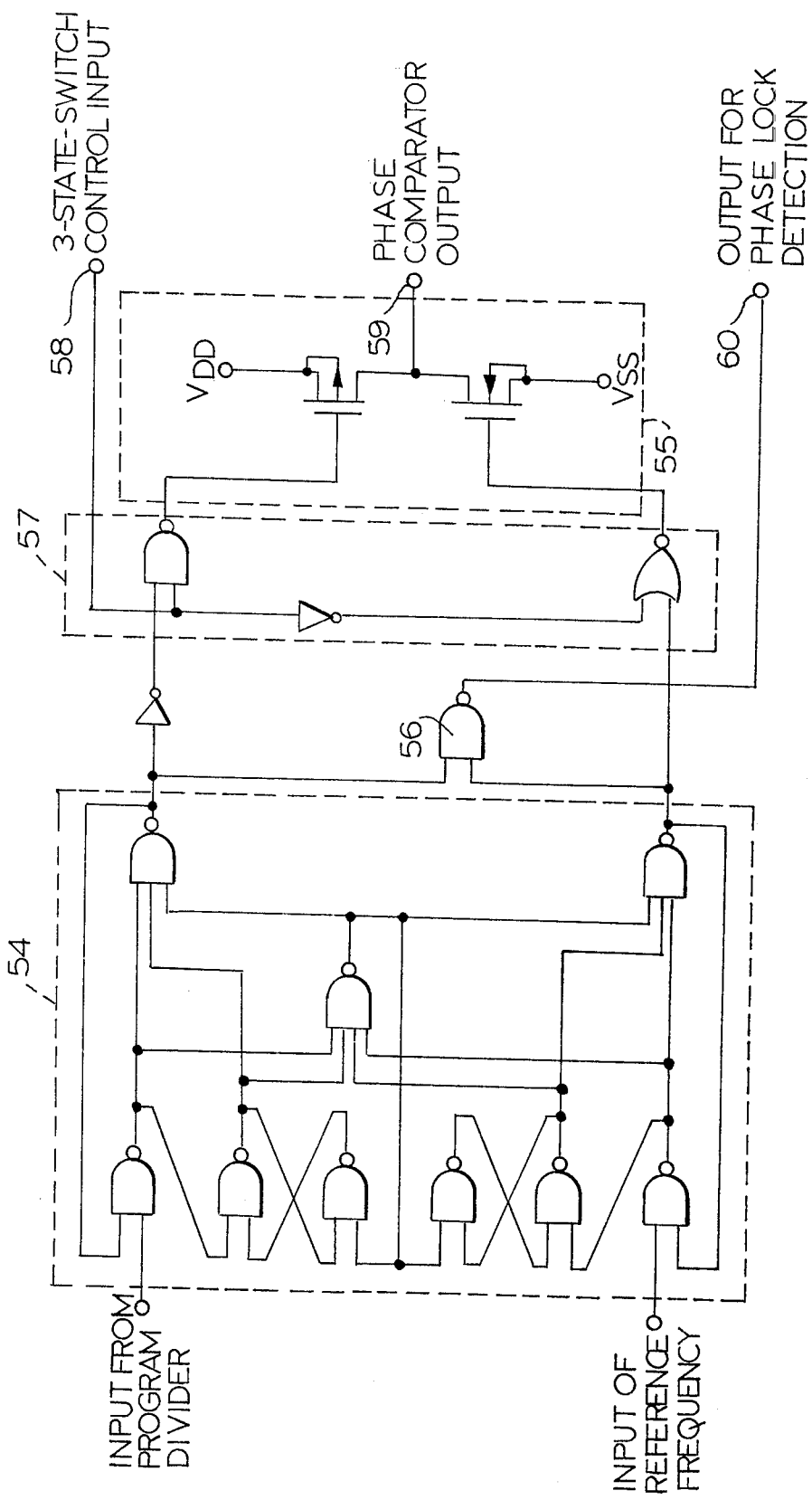
FIG. 7 is a circuit diagram showing a practical form of a phase detector, a charge pump and a three state switch of the channel selector according to the invention.

A phase comparator 54, a part of charge-pump circuit 55 and a gate for phase-lock detection 56 are generally known, and their operation is well known. Accordingly their detailed explanation is omitted here. In FIG. 7, a 3-state-switch-control circuit 57 is added. When the 3-state-switch-control-input terminal 58 is at a low level, the phase comparator output terminal 59 is in a floating state. From the phase-lock-detector-output terminal 60, a low level output is obtained when the PLL is locked, and a pulse output is obtained when it is unlocked.

At the moment when the time $T_2$ finishes, the dividing ratio of the programmable divider 23 is varied to the ratio for the local oscillating frequency $f_2$ shown in FIG. 3 according to the output of the code converter 30 using the output of the PLL timing counter 40. The local oscillation frequency increases during the time $T_5$, and when it reaches the frequency $f_2$, a low level output is obtained from the phase-lock-detector-output terminal 60. In practice, a low pass filter is connected to the terminal 60, and the output of the low pass filter is at a low level in the locked state of PLL and is at a high level in the unlocked state. The phase-lock detector 42 including this low pass filter is shown in FIG. 2.

The output of the phase-lock detector 42 controls PLL-search-switch circuit 41, so as to make the charge-pump and 3-state-switch circuit 25 free from the floating state. That is, the PLL is closed. At the same time, the switch circuit 41 controls the voltage-integrator controller 36 so as to set back the output of the voltage integrator 36 to the sweep starting reference voltage. Furthermore, the phase-lock detector 42 controls the code converter 30, which programs the programmable divider 23 so that the PLL synthesizes the local oscillation frequency $f_0$. Then the operation in time $T_1$ repeats again. Therefore, when there is a transmitted signal again, the search tuning system will be in a receiving state.

The frequency $f_0$ and $f_2$ are designed to be determined so that they have certain frequency intervals. Each of these intervals can be taken to be equal in all channels, because they are independent of the sensitivity of the local oscillator.

FIG. 8 shows a practical example of the part which connects the PLL to the search tuning system. Referring to the FIG. 8, 61 is a reference discriminator and corresponds to element 33 shown in FIG. 2. Element 62 is constructed as a voltage subtracter, but this corresponds to the voltage adder 35 shown in FIG. 2. Element 63 is a voltage-integrator controller and corresponds to element 36 shown in FIG. 2. A terminal 64 is connected to an output terminal of a PLL-search-switch circuit 41. Element 65 is an integrating resistor and element 66 is an integrating capacitor. An operational amplifier 67 forms a voltage integrator with resistor 65 and capacitor 66. Element 68 corresponds to the charge-pump and 3-state-switch circuits 25. Element 69 is a low pass filter of the PLL and corresponds to element 26 shown in FIG. 2. A voltage adder 70 having a unity gain connects the PLL to the search tuning system, and its output is connected to the voltage controlled local oscillator, which corresponds to element 21 shown in FIG. 2. This adder 70 corresponds to the voltage adder 70 shown in FIG. 2.

As previously described, during the PLL time $T_1$, the output of the voltage integrator 37, which is formed by elements 65, 66 and 67 shown in FIG. 8, is required to correspond to the sweep-starting reference voltage. In the case of FIG. 8, a grounded (zero) voltage which is positive with respect to the grounded voltage is applied to positive voltage to the grounded voltage is to be applied to the integrating resistor 65. If during the time $T_1$ a positive voltage is applied to the terminal 64 from the PLL-search-switch circuit 41 shown FIG. 2, this state can be obtained, because transistor 72 conducts and therefore the voltage of ($-$) terminal of the voltage subtractor 62 becomes lower than the voltage of ($+$) terminal. Here, in the case of no input into the discriminator, its output is positive, for example, plus 6.5 volts.

Next, during the time $T_2$, the grounded voltage, or 0 volts, is applied to the terminal 64 from the PLL-search-switch circuit 41. Because of the non-conducting of transistor 72, the voltage of ($+$)B power source is divided by a variable resistor 73 and a resistor 74 and the divided voltage is applied to the ($-$) input terminal of the voltage subtractor 62. This voltage is made higher than the 6.5 volts mentioned above, for example, plus 9 volts. In this manner, the voltage, 6.5 volts $-9$ volts $= -2.5$ volts, is applied to the integrator formed by elements 65, 66 and 67 from the voltage subtractor 62, and its output voltage corresponds to its sweep state.

As described with reference to FIG. 4 (a), (b) and equations (1) to (4), during the time $T_2$ mentioned above, even though the swept voltage is applied to the PLL, the local oscillation frequency has a very small error from the determined frequency $f_0$ to the transmitting frequency of the desired receiving channel. In the phase-lock detector 42 shown in FIG. 2, the low pass filter is incorporated and is designed so as to obtain its output as PLL-locked signal even for this small error. In the example of FIG. 7, it is zero volt.

The sweep-state of the output of the voltage integrator 37 is continued. Then, after the moment that the local oscillation frequency passes the frequency $f_0$, the output of the phase-lock detector 42 becomes positive. This output controls the PLL-search-switch circuit 41, and the output of 41 causes the charge-pump and 3-state switch circuits 25 to be floating. That is, the system operates in the time $T_3$ shown in FIG. 3.

The operation in times $T_3$ and $T_4$ have been already described in detail. The manual fine adjustment of the intermediate frequency in the description is effected by the variable resistor 73 shown in FIG. 8.

When the local oscillation frequency reaches $f_2$ through time $T_5$, the positive voltage is applied to the terminal 64, and as a result the voltage-integrator output returns to the sweep-starting reference voltage. That is, the system operates in the time the same as $T_1$ and repeats the operation mentioned above.

Figure 9:
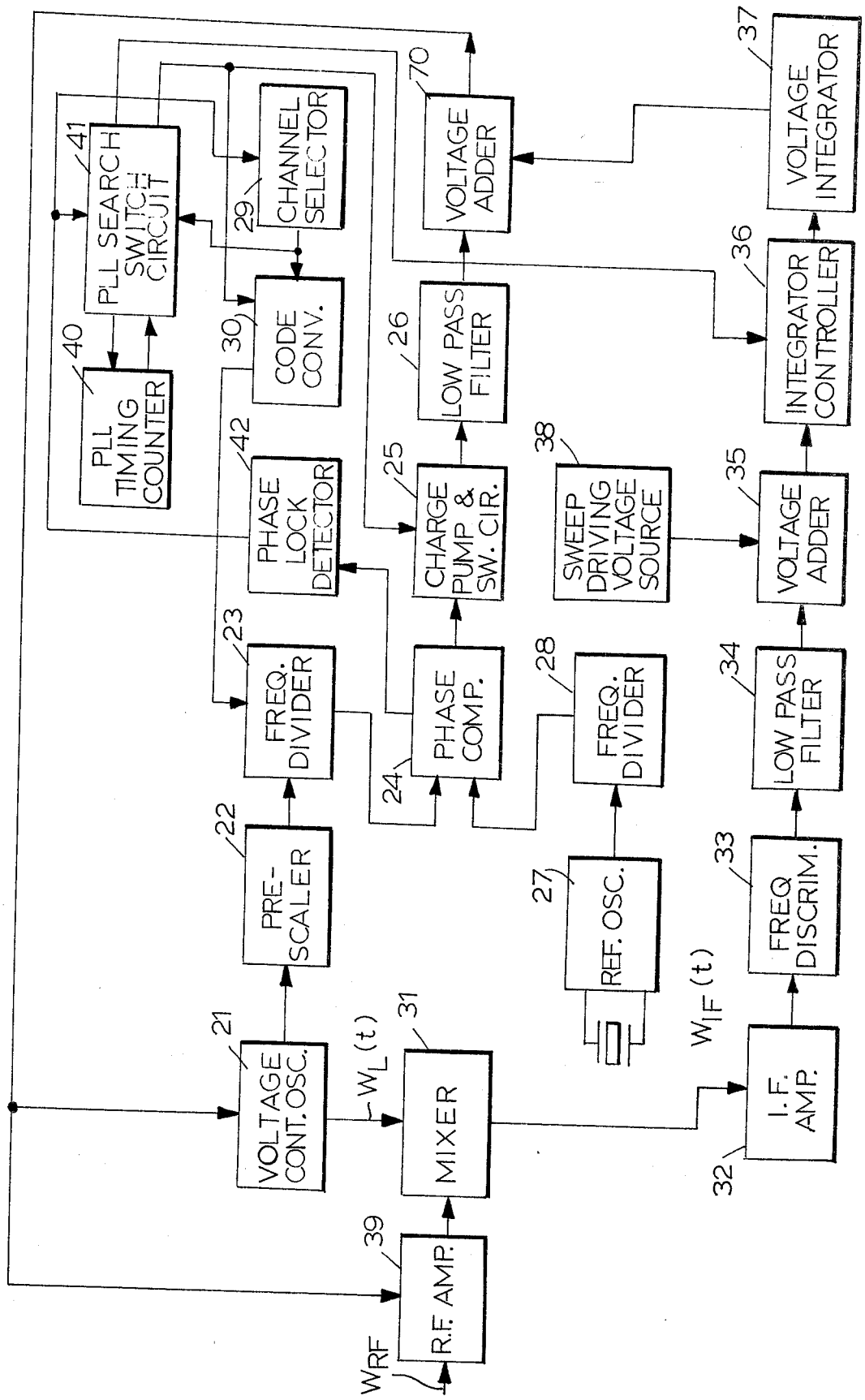
FIG. 9 is a block diagram of a second embodiment of the invention.

FIG. 9 is a block diagram of the second embodiment of the present invention. Respective numbers for respective blocks are the same as the numbers of the blocks shown in FIG. 2 respectively, and only the connection between the phase-lock detector 42 and the code converter 30 through the channel-entry apparatus 29 is different.

Figure 10:
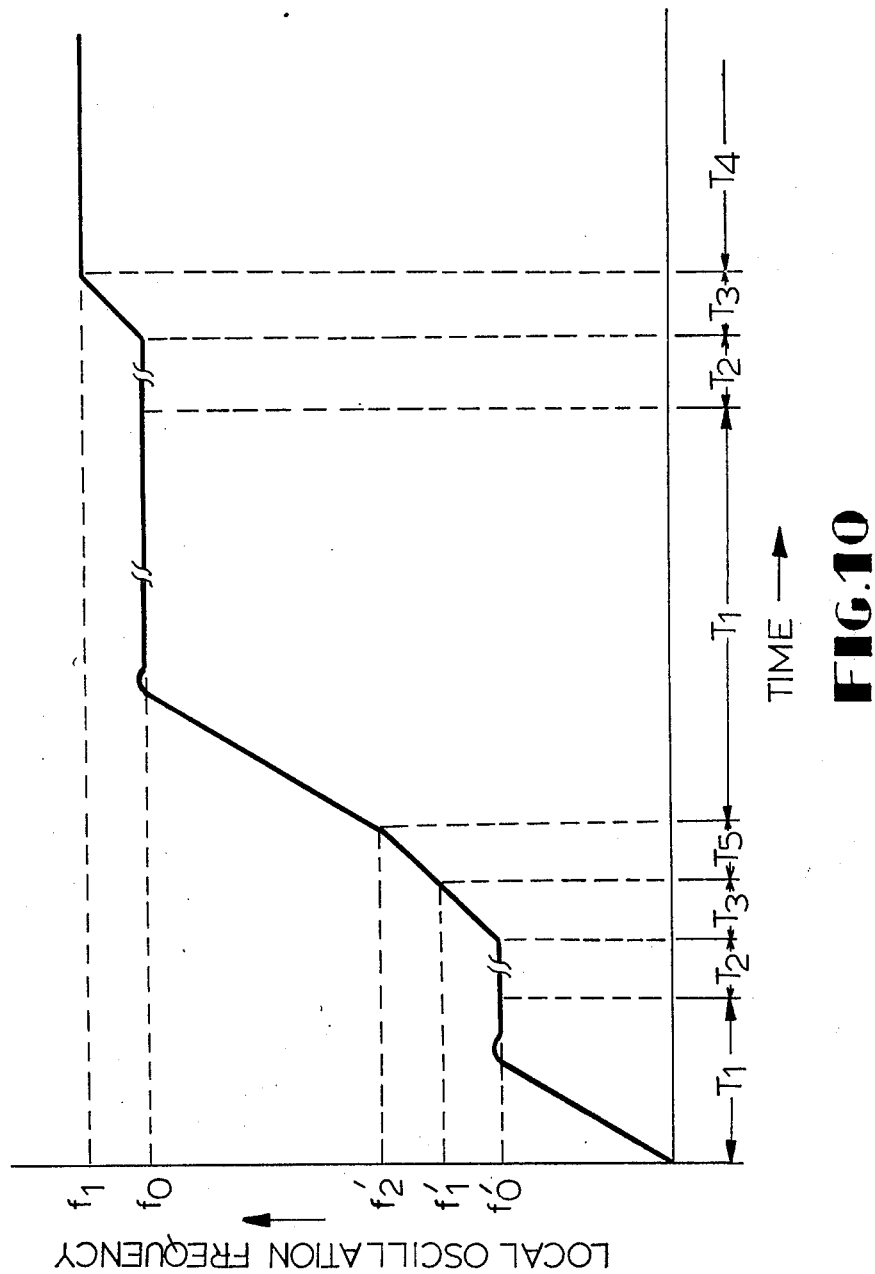
FIG. 10 is a diagram for explaining the operation of the second embodiment.

FIG. 10 is drawn for explanation of channel-selector operation of the second embodiment. Times $T_1$, $T_2$, $T_3$ or $T_4$ shown here corresponds to the times $T_1$, $T_2$, $T_3$ or $T_4$ shown in FIG. 3 respectively, and each operation of the times of the channel selector is the same as each operation which has been already described.

This embodiment is for channel seek for broadcasting station. If there is not a transmitting signal of a certain channel, although the PLL frequency synthesizer once synthesizes a local oscillation frequency $f_0'$ corresponding to the closed frequency of the transmitting frequency, and although a swept local oscillation frequency output reaches a local oscillation frequency $f_1'$ corresponding to the transmitting frequency, a tuning state does not take place, and further the frequency sweep continues. Then at the moment when the swept frequency reaches the opposite-side-closed frequency $f_2'$ through time $T_5$, the next channel seeking starts.

According to the configuration shown in FIG. 2, when the local oscillation frequency reaches $f_2'$, the phase-lock detector 42 controls the code converter 30 so that the programmable divider 23 is controlled for the local oscillation frequency to be $f_0'$, but according to the configuration shown in FIG. 9, the system does not operate like this. Instead of $f_0'$, the PLL system synthesizes the local oscillation frequency $f_0$ corresponding to the closed frequency of an adjacent channel (see FIG. 10).

In other words, the output of the phase-lock detector 42 controls the channel entry apparatus so that channel number to be selected increases by one. Then, according to the operation explained using FIG. 3, the local oscillation frequency sweeps to the local oscillation frequency $f_1$ of the channel where there is a transmitting signal, and here the search tuning system reaches steady state.

Figure 11:
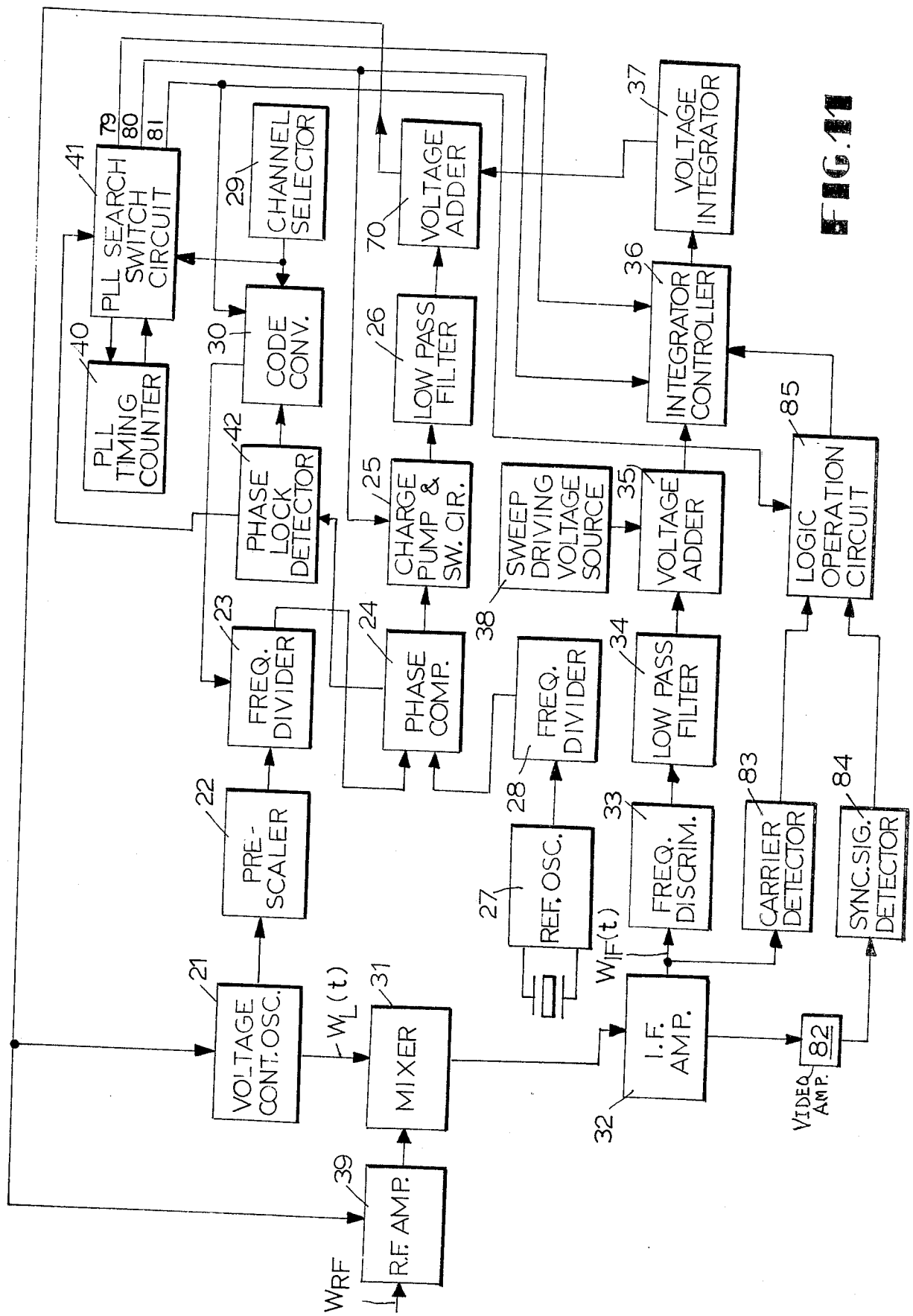
FIG. 11 is a block diagram of the third embodiment of the invention.

FIG. 11 is the block diagram of the third embodiment of the present invention. In this diagram, the PLL frequency synthesizer illustrated by designations 21 to 30 and 70, and the search tuning system illustrated by designations 21 and 31 to 39 are taken to be the same as the configuration of FIG. 2.

PLL timing counter 40 is used for determining the time $T_1$ during which only the PLL is formed as closed loop. PLL-search-switch circuit 41 is controlled by the output of the channel entry apparatus or channel selector 29, the output of the phase-lock detector 42 or PLL timaing counter 40 and controls the charge-pump and 3-state circuits 25, the voltage-integrator controller 36 and the code converter 30. The output from the terminal 80 of the switch circuit 41, during time $T_1$, through charge pump and switching circuit 25, charges or pumps the capacitor of the low pass filter 26 so as to close the PLL. During the time $T_2$, the output of the terminal 80 also keeps the PLL in its closed loop states.

On the other hand, the voltage-integrator controller 36 during the time of $T_1$ keeps the output of the voltage integrator 37 at a sweep-starting-reference voltage, and enables it to be in its sweep state during the time $T_2$.

After the moment when the time period $T_2$ finishes, the output from the terminal 80 of the PLL-search switch circuit 41 controls the charge-pump and 3-state-switch circuits 25 so that the input terminal of the low pass filter 26 is in its floating state. That is, it causes the PLL to operate open loop. During the time period after time $T_2$ finishes, that is, $T_3$, using the output from the terminal 80, the switch circuit 41 controls the voltage-integrator controller 36 so that the search tuning system remains as a closed loop and searches a video carrier from the closed frequency which is higher than the video carrier frequency. The local oscillation frequencies which correspond to said video carrier frequency and closed frequency are taken as $f_1$ and $F_0$ respectively, and the manner of the operation mentioned above is illustrated in FIG. 12.

The operation of the PLL during the time $T_2$ is the same as the manner explained referring FIG. 4 (a) and (b). FIG. 3 in the above explanation corresponds to FIG. 12 in this embodiment.

Figure 12:
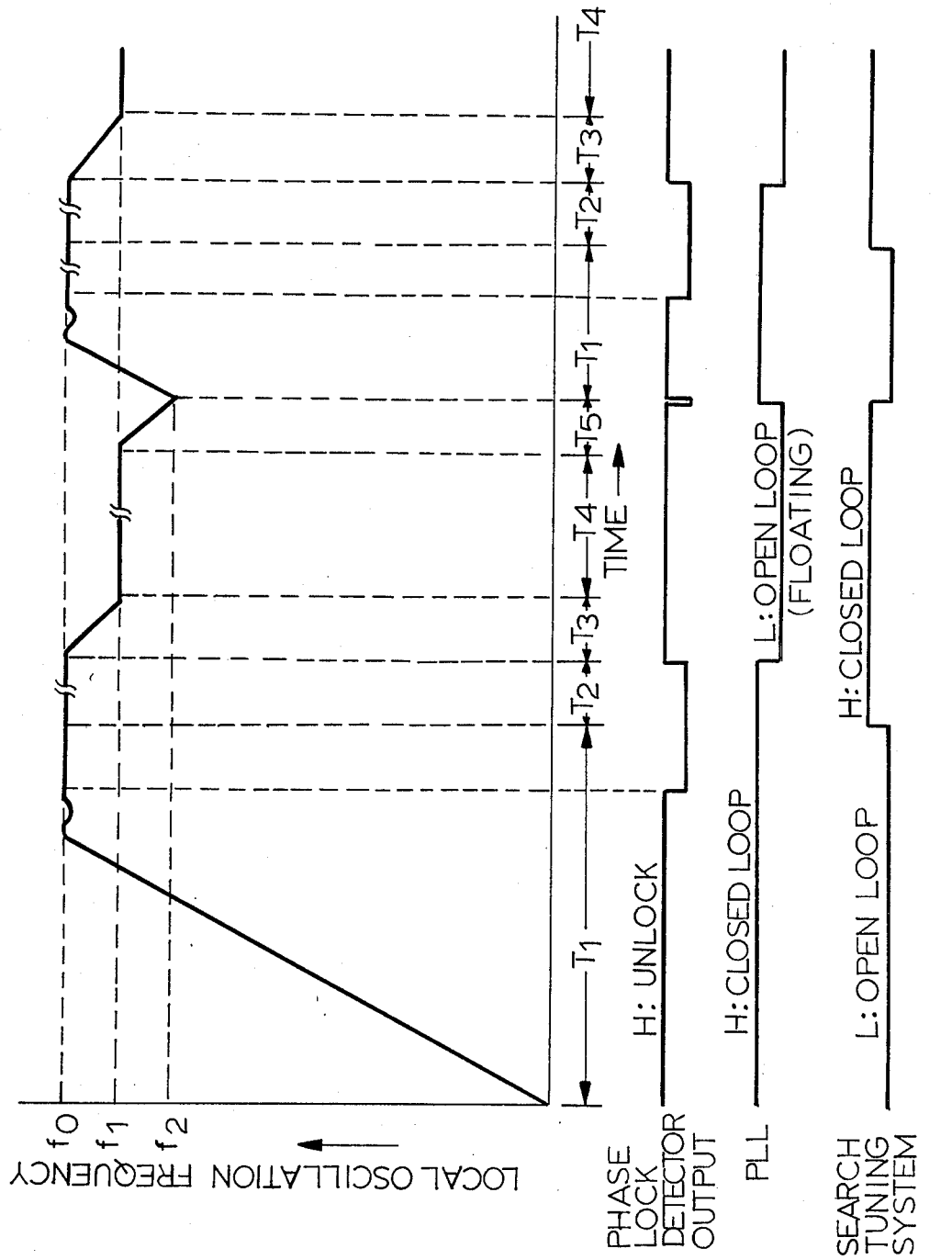
FIG. 12 is a diagram for explaining a part of operation of the third embodiment.

If $f_0$ on the local oscillation-frequency axis shown in FIG. 12 corresponds to the closed frequency of the transmitting frequency of the desired channel, it may be understood from the above explanation that the channel selector having the configuration shown in FIG. 11 establishes the closed frequency of the transmitting frequency and stands by to search the broadcast wave from the closed frequency.

Figure 6:
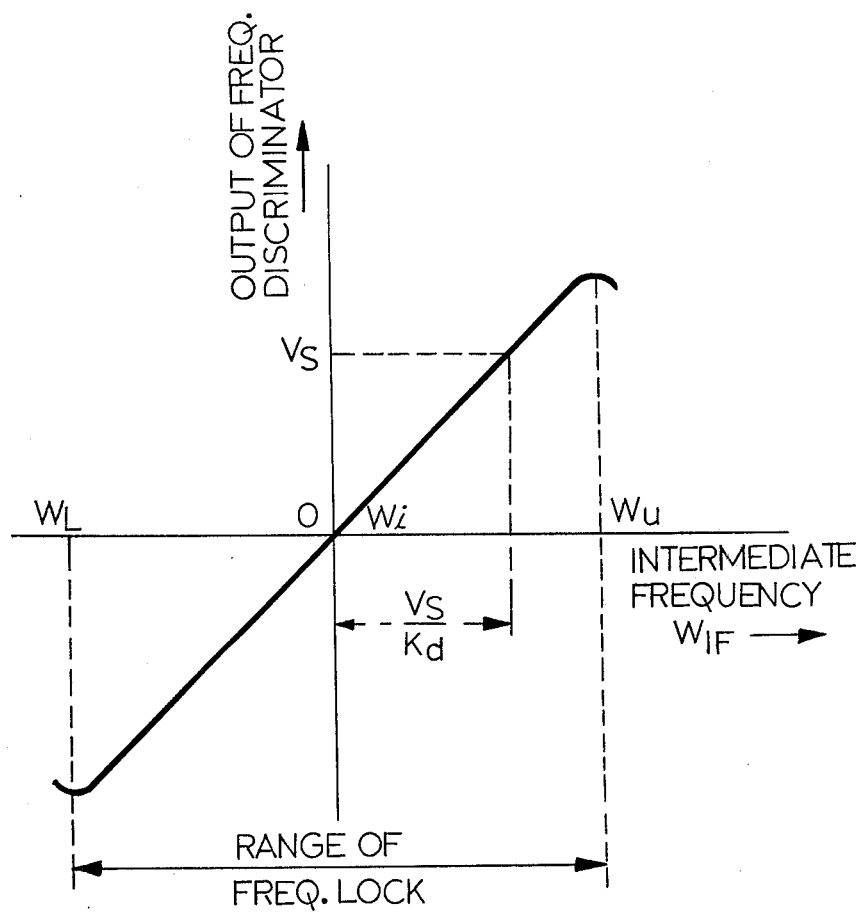
FIG. 6 is a diagram showing the relationship between a frequency discriminator characteristics and a reference input frequency $\omega_i$ of the search tuning system of a frequency error $-V_s/K_d$ in steady state.

The explanation of the operation of the search tuning system during the time $T_3$ and $T_4$ is omitted here, because it has been already explained using the model shown in FIG. 5 and the characteristics of the frequency discriminator shown in FIG. 6. Only the direction of frequency sweep is different. The operation of the circuit of FIG. 2, FIG. 3 and FIG. 8 according to the above explanations correspond to the operation of the circuits of FIG. 11, FIG. 12 and FIG. 14, respectively.

If the transmitted signal disappears at the end of time period $T_4$ shown FIG. 12, the intermediate frequency in the search tuning system disappears. Therefore, the output of the local oscillator 21 decreases, and the system detunes and cannot receive the transmitted signal again, even though it reappears again.

In order to prevent this problem, in the configuration shown in FIG. 11, the output of the phase-lock detector 42 is obtained using the information from the phase comparator 24, and the configuration is arranged such that the output controls the programmable divider 23 through the code converter 30 and controls the PLL-search-switch circuit 41. The operation of this part has been already described referring FIG. 7, so the explanation of it will be omitted here.

After the time period $T_2$ finishes, the output of the code converter 30 is changed by the output of the terminal 81 of the PLL-search-switch circuit 41 so that the dividing ratio of the programmable divider 23 is changed to prepare the synthesize the local oscillation frequency $f_2$ shown in FIG. 12. During the time $T_5$ the local oscillation frequency decreases, and when it reaches $f_2$, a low level output is obtained from the terminal 60 of the phase-lock detector. In practice, a low pass filter is connected to this terminal, and its output is a low level at the locked state of the PLL and is a high level at the unlocked state of the PLL. The phase-lock detector 42 incorporating this low pass filter is shown in FIG. 11.

The output of the phase-lock detector 42 controls the PLL-search switch circuit 41 so that the output of the terminal 80 causes the charge-pump and 3-state switch circuits 25 to be in their unfloating state. That is, it closes the PLL. At the same time, the output of the terminal 79 of the switch circuit 41 controls the voltage-integrator controller 36 so that the output of the voltage integrator 37 returns to the sweep-starting reference voltage. Further, the phase-lock detector 42 controls the code converter 30, the output of which programms the programmable divider 23 for the PLL to synthesize the local oscillation frequency $f_0$. Then the operation in the time period $T_1$, as noted above, starts again. Therefore, when the transmitted signal appears again, the search tuning system will be in its receiving state.

The frequency $f_0$ and $f_2$ are designed to be determined so that they have certain frequency intervals. Each of these intervals can be taken to be equal in all channels, because they are independent of the sensitivity of the local oscillator.

According to the television broadcast standard, the video carrier frequency is higher than the lowest frequency of the channel by 1.25 MHz and is higher than the adjacent sound carrier frequency by 1.5 MHz. Therefore, if the frequency intervals between $f_0$ and $f_1$ or between $f_1$ and $f_2$ are taken to be less than 1.25 MHz, the sound carrier of the adjacent channel is not tuned. This is true for both directions of the search.

However, in cable-television systems (CATV), occasionally a transmitting carrier frequency has a large offset frequency from the nominal frequency given for television broadcast. If the offset frequency is 1.5 MHz, the frequency interval mentioned above must be 1.5 MHz to correct it automatically.

In the case of receiving a television broadcast signal by the channel selector mentioned above, if the search direction from the frequency $f_0$ is from lower side to upper side, there is an anxiety for search-tuning to the adjacent sound carrier. From this point of view, in the embodiment shown in FIG. 11, the search direction is arranged to be from higher side to lower side so that the local oscillation frequency $f_0$ corresponding to the closed frequency of the video carrier frequency is chosen on the opposite side of the adjacent sound carrier frequency of the local oscillation frequency $f_1$ corresponding to the video carrier frequency.

Even if the search direction is arranged in the above manner, in the case of no video carrier the adjacent sound carrier is tuned. For this reason, in the present invention, using a carrier detector 83 connected to a conventional video amplifier 82, a synchronous signal detector 84 and a logic operation circuit 85, verification is made whether a receiving carrier is the video carrier or the adjacent sound carrier. This verification operation will be explained below with reference to FIGS. 13(a)–13(e').

The time while the search tuning system is in closed loop state consists of time period $T_2$ while the output of the voltage integrator 37 is in increasingly swept state and the time periods denoted as $T_3$, $T_4$ and $T_5$ while the output is in decreasingly swept state as shown in FIG. 12. In order to realize this operation, the output from the terminal 79 of the PLL-search switch circuit 41 shown FIG. 11 controls the voltage-integrator controller 36 so that the search tuning system becomes closed loop, and the output from the terminal 80 controls the same voltage-integrator controller 36 so that the sweep direction of the search tuning is changed while the PLL is in its open loop state. That is, in the latter case the search direction is from higher to lower side in frequency.

Figure 13A:
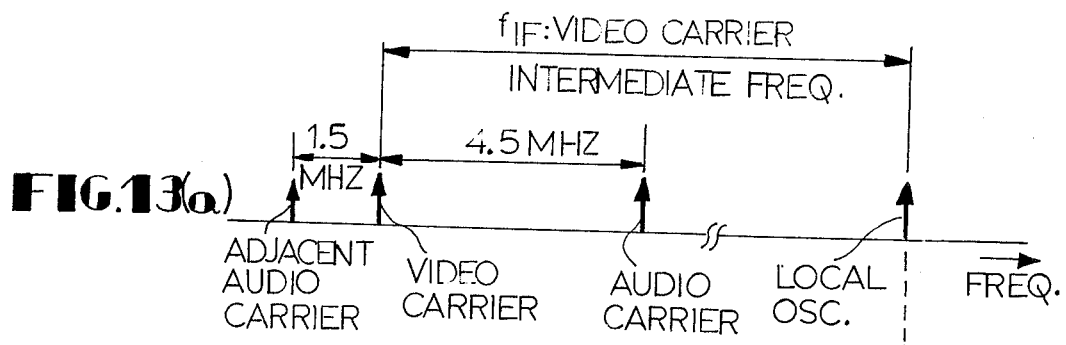
FIGS. 13a-13e' are diagrams for explaining the operation of the third embodiment.
Figure 13B:
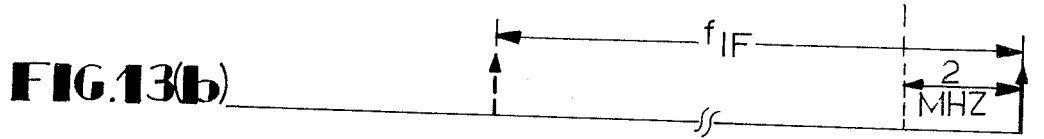
Figure 13C:
Figure 13D:
Figure 13E:

FIGS. 13(a)–13(e') illustrate the frequency relationship of the video carrier and sound carrier of the desired receiving channel, the nominal local oscillation output and the adjacent sound carrier.

In the case when the local oscillation frequency $f_0$ is determined to be higher than a nominal frequency by 2 MHz, if there is not an arriving signal which has frequency relationship as illustrated by FIG. 13 (b), a video-carrier-intermediate frequency output $f_{IF}$ illustrated in FIG. 13 (b') is not obtained from the carrier detector 83. The local oscillation frequency has decreased, and when the frequency reaches the nominal frequency $f_1$ illustrated in FIG. 13 (c), $f_{IF}$ output illustrated in FIG. 13 (c') is obtained. The local oscillation frequency further decreases to a frequency which is lower by 1.5 MHz than the nominal frequency as illustrated in FIG. 13 (d), and if there is an adjacent sound carrier, the $f_{IF}$ frequency output is obtained as illustrated in FIG. 13 (d'). If the local oscillation frequency $f_2$ shown in FIG. 12 is lower by 2 MHz than the nominal frequency as illustrated in FIG. 13 (e), and if there is no arriving signal, the $f_{IF}$ frequency output illustrated in FIG. 13 (e') is not obtained.

Though the transmitted video carrier has an offset frequency within 2 MHz, if the carrier is modulated by a standard television signal, a vertical or horizontal synchronous signal can be obtained from the synchronous signal detector 84. In this case, if there is an adjacent carrier, the frequency of the carrier is lower than the video carrier frequency.

Therefore, the verification (i.e.—determination) whether a received carrier is the video carrier or the adjacent sound carrier can be effected by using the following logic operation of the output of the carrier detector 83 and the output of the synchronous signal detector 84 in the logic operation circuit 85.

Case 1: If the carrier detector 83 once detects the carrier and the synchronous signal detector 84 detects a synchronous signal, then the search tuning system is tuning the video carrier of the desired receiving channel.

Case 2: If the carrier detector 83 twice detects the carrier and the synchronous detector 84 does not detect a synchronous signal, then the search tuning system is not tuning the video carrier of the desired receiving channel, but is tuning the adjacent sound carrier.

Case 3: If the carrier detector 83 twice detects the carrier and the synchronous signal detector 84 detects a synchronous signal, then the search tuning system is first tuning the video carrier and then detunes due to the disappearance of the transmitted signal and subsequently is tunging the adjacent sound carrier.

In order to reset the circuit for counting the number of carrier-detections at the end of time period $T_2$, the output of terminal 81 of the PLL-search switch circuit 41 controls the logic operation circuit 85.

A practical example of the part of the connecting configuration of the PLL and the search tuning system is shown in FIG. 14. In this diagram, designation 61 is a frequency discriminator corresponding to element 33 shown in FIG. 11. Element 62 forms a voltage subtractor, but corresponds to the voltage adder 35 shown in FIG. 11. 63 is a voltage-integrator controller corresponding to element 36 shown in FIG. 11, and a terminal 64 is connected to the output terminal 79 of the PLL-search-switch circuit 41. Element 65 is an integrating resistor and element 66 is an integrating capacitor. An operational amplifier 67 forms the voltage integrator with elements 65 and 66. Element 66 corresponds to the charge-pump and 3-state-switch circuits 25. Element 69 is a low pass filter and corresponds to element 26 shown in FIG. 11. A voltage adder 70 with a unity gain connects the PLL with the search tuning system and is connected to the voltage controlled local oscillator corresponding element 21 shown in FIG. 11. This adder 70 corresponds to the voltage adder 70 shown in FIG. 11.

As mentioned beforehand, during the PLL time period $T_1$, the output of the voltage integrator 37 shown in FIG. 11, which is formed by elements 65, 66 and 67 in FIG. 14, should remain at the sweep-starting-reference voltage. In FIG. 14, the voltage is taken as the grounded (zero) voltage. For this stage, a positive voltage is required to be added at the integrating resistor 65 from the voltage subtractor 62. If a positive voltage is applied to terminal 64 shown in FIG. 14 from the PLL-search-switch circuit 41 shown in FIG. 11 during the time period $T_1$, this state can be obtained, because transistor 72 becomes conductive and therefore the voltage of the (−) terminal of the voltage subtractor 62 becomes lower than the voltage of the (+) terminal. Here, in the case of no input to the frequency discriminator, the output voltage of the discriminator is positive, for example, plus 6.5 volts.

During the time period $T_2$, (the grounded voltage, or zero volts), is applied to terminal 64 from the output terminal 79 of the PLL-search-switch circuit 41. Because of the nonconducting of transistor 72, the voltage of the (+) B power source divided by the series string comprising variable resistor 73 and resistor 74 is applied at the (−) input terminal of the voltage subtractor 62. This divided voltage is made higher than the plus 6.5 volts mentioned above, for example, plus 9 volts. In this manner, the voltage, 6.5 volts −9 volts = −2.5 volts, is applied to the integrator formed by elements 65, 66 and 67 from the voltage subtractor 62, and its output corresponds to its sweep state.

Figure 4A:
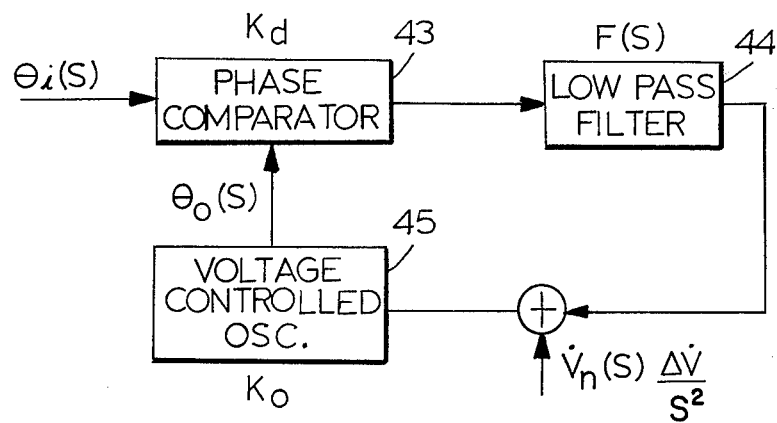
FIGS. 4 (a), (b) are block diagrams of the model of the PLL in the case when a sweeping voltage is added to a low pass filter output of the PLL.
Figure 4B:
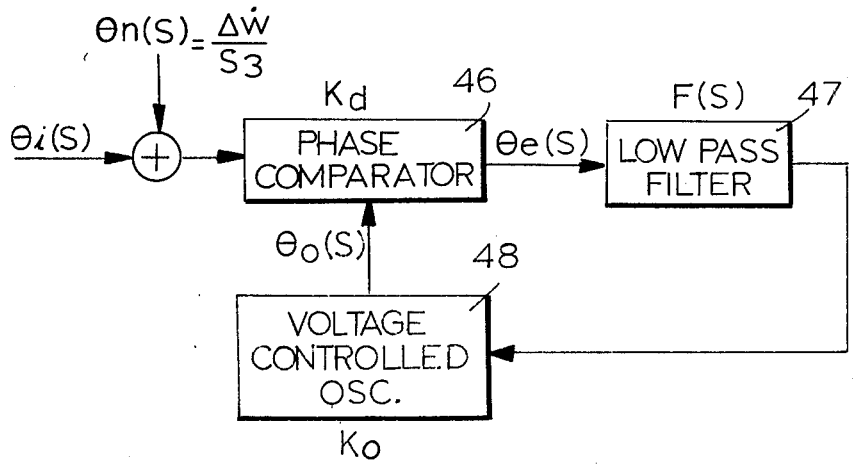

As illustrated in FIGS. 4(a)–(b) and equations (1) to (4), during the time period $T_2$ mentioned above, even though the swept voltage is applied to the PLL, the local oscillation frequency has a very small error from the determined frequency $f_0$ to the transmitting frequency of the desired receiving channel. In the phase-lock detector 42 shown in FIG. 11, the low pass filter is incorporated and is designed so as to obtain its output as a PLL-locked signal even for this small error.

The sweep-state of the output of the voltage integrator 37 continues until the local oscillation frequency passes the frequency $f_0$, then the output of the phase-lock detector 42 becomes positive. This output controls the PLL-search-switch circuit 41, and the output of 41 causes the charge-pump and 3-state switch circuits 25 to be floating. That is, the system operates in the time period $T_3$ as shown in FIG. 12.

The output which is obtained at terminal 80 is also applied to terminal 75 shown in FIG. 14 as a positive voltage and causes transistor 76 to be conductive. A variable resistor 77 is adjusted so that the voltage of the (−) terminal of the voltage subtractor 62 is lower than the voltage of the (+) terminal. In this case, the output of the voltage subtractor 62 becomes positive, and the output of the voltage integrator is caused to be swept to the lower voltage.

At terminal 78, the output of the logic operation circuit 85 shown in FIG. 11 is applied. According to the result of the logic operation mentioned previously, a positive voltage is obtained except for the case when search tuned carrier is not the video carrier. This positive voltage detunes the search tuning system.

When the local oscillation frequency reaches $f_2$ through time period $T_5$, the positive voltage is applied to terminal 64, and as a result the voltage-integrator output returns to the sweep-starting reference voltage. That is, the system operates in a time period which is the same as period $T_1$ and repeats the operation mentioned above.

FIG. 15 shows a practical example of the logic operation circuit 85. A terminal 86 shown in this figure is connected to the output terminal 81 of the PLL-search-switch circuit 41. The output voltage from 81 resets a flip-flop 90 through a differentiation circuit 89 and causes its output to be "0" level. A terminal 87 is connected to the output terminal of the carrier detector 83 shown FIG. 11. By inputting the output from 83 once, the flip-flop output is inverted to "1" level. Further, when the output is inputted once more, the flip-flop output is inverted again to "0" level. The terminal 88 is connected to the output terminal of the synchronous signal detector 84 shown FIG. 11. If there is a synchronous signal, then a "1" level input is applied at this terminal. The output of flip-flop 90 and the input from the terminal 88 are input to a NAND gate 91, and its output is input at an input terminal of an AND gate 92. To the other input terminal of the AND gate 92, the terminal 87 is connected so that only upon the detection of the output of the carrier detector, is the output of NAND gate 91 supplied to a terminal 93.

The output of terminal 93 controls the voltage-integrator controller 36 shown in FIG. 11. If the practical example of the voltage-integrator controller 36 is that shown by element 63 in FIG. 14, this output is applied to the terminal 78.

As described above, according to the present invention, because the tuning operation is done by the search tuning system, there is no anxiety of the frequency hunting in the AFT mode in contrast to the conventional PLL frequency synthesizer system, and the prior art problem wherein one step of the local oscillation frequency varies discretely by different values according to the desired receiving channel can be solved. In addition, the tuning system of the present invention has a feature wherein digital noise is not generated contrary to the conventional PLL.

Further, by enabling the sweep driving voltage $V_s$ to be variable, manual fine tuning of the local oscillation frequency can be performed.

Furthermore, even if the search tuning system detunes due to the dissappearance of the transmitted signal, the channel selector according to the present invention does not erroneously operate, because the search tuning system is switched to the PLL system at the moment when the local oscillation frequency reaches the frequency $f_2$ corresponding to the ratio programmed at the end of the time period $T_2$.

Still furthermore, in the embodiment shown in FIG. 9, because the PLL operation takes place at a frequency close to the local oscillation frequency of the adjacent channel at the moment when the local oscillation frequency reaches $f_2'$ (see FIG. 10), even if the sound carrier is included in the same channel besides the video carrier as in a television broadcast, the sound carrier is not tuned by the search tuning system. Therefore, a circuit to distinguish between the video carrier and the sound carrier is not necessary.

Yet furthermore, in the embodiment shown in FIG. 11, because the local oscillation frequency $f_0$ corresponding to the frequency close to the video carrier is selected to be on the opposite side of the local oscillation frequency corresponding to the adjacent sound carrier frequency across from the local oscillation frequency corresponding to the video carrier frequency, and because the transmitted signal is searched from a higher frequency to a lower frequency, if there is a video carrier, the search tuning system tunes the video carrier in spite of the existence of an adjacent sound carrier.

Yet still furthermore, in this embodiment, because the logic operation circuit verifies (e.g.—determines) that the search tuning system is in the tuning state of the video carrier if the carrier-detector output is once detected and a synchronous-signal-detector output is also detected, and verifies that the search tuning system is in the tuning state of the adjacent sound carrier if the carrier-detector output is once detected and the synchronous-signal-detector output is not detected or if the carrier-detector output is twice detected and the synchronous-signal-detector output is also detected, it is not necessary to use the sound carrier detector 15" and the channel verification signal is easily obtained even in a weak signal area.

What is claimed is:

1. A channel selector comprising:
    a phase locked loop (PLL) frequency synthesizer which synthesizes a local oscillation frequency corresponding to a closely determined frequency to a transmitting signal of a desired receiving channel;
    a search tuning system;
    means for adding an output of a voltage integrator of said search tuning system which is in sweeping state to an output of a low pass filter of said PLL; means for causing said PLL to be an open loop, when an added voltage obtained by said means reaches a voltage corresponding to said closely determined frequency; and means thereafter for searching said transmitting signal by said search tuning system for causing said search tuning system to be in search tuning state.

2. A channel selector according to claim 1, wherein a sweep driving voltage of said search tuning system is variable so as to enable fine adjustment of a local oscillation frequency of said search tuning system.

3. A channel selector according to claim 1 further comprising means for controlling a dividing ratio of a programmable divider of said PLL frequency synthesizer, so that said PLL frequency synthesizer will synthesize said closely determined frequency again, when a local oscillation frequency reaches a closely determined frequency across a frequency of said transmitting signal in the opposite side of said closely determined frequency after breaking said transmitting signal.

4. A channel selector according to claim 1 further comprising:
    means for detecting a detector output when there is not said transmitting signal of a desired receiving channel; and means for controlling a dividing ratio of said a programmable divider of said PLL frequency synthesizer so as to cause a channel selection number to increase by one for PLL frequency synthesizer to synthesize a closely determined frequency to a transmitting signal of the channel of said channel selection number.

5. A channel selector according to claim 1, wherein said transmitting signal of a desired receiving channel is a video carrier of television broadcast, and the channel selector further comprises means for deciding a local oscillation frequency corresponding to the closely determined frequency of said video carrier to be in the opposite side of a local oscillation frequency corresponding to an adjacent sound carrier frequency across a local oscillation frequency corresponding to said video carrier frequency.

6. A channel selector according to claim 5, further comprising:
   a logic operation circuit for verifying that said search tuning system is in the tuning state in said video carrier if a carrier-detector output is once detected and a synchronous-signal-detector output is also detected, and for verifying that said search tuning system is in the tuning state in said adjacent sound carrier if said carrier-detector output is once detected and said synchronous-signal-detector output is not detected or if said carrier-detector output is twice detected and said synchronous-signal-detector output is also detected;
   means for controlling the voltage-integrator controller which controls a voltage integrator by the output of said logic operation circuit; and
   means for causing said search tuning system to be in detuned state if said search tuning system becomes to be in tuning state in said adjacent sound carrier.

7. A channel selector comprising:
   a R.F. amplifier means for receiving and amplifying an R.F. input signal;
   a mixer means operatively connected to an output of said R.F. amplifier means and a voltage control oscillator means having an output operatively connected to said mixer means, said mixer means providing an output whose frequency corresponds to the frequency difference between said outputs provided by said R.F. amplifier means and said voltage control oscillator means;
   an I.F. amplifier means operatively connected to said mixer means output for amplifying the output of said mixer means;
   a frequency discriminator means operatively connected to an output of said I.F. amplifier means for providing an output whose amplitude is proportional to the frequency of said output of said I.F. amplifier means;
   a low pass filter means operatively connected to said output of said frequency discriminator means for passing output signals having a frequency below a predetermined frequency;
   a voltage adder means operatively connected to an output of said low pass filter means and a sweep driving voltage source means having an output operatively connected to said voltage adder, said voltage adder means providing an output corresponding to the sum of said output of said low pass filter means and said output of said sweep driving voltage source means, said sweep driving voltage source means providing a voltage output;
   a voltage integrator means operatively connected to said output of said voltage adder means for integrating the output of said voltage adder means;
   an additional voltage adder means operatively connected to said output of said voltage integrator means and an additional low pass filter means operatively connected to an output of said additional voltage adder means, said additional voltage adder means providing an output corresponding to the sum of said outputs of said voltage integrator means and said additional low pass filter means;
   said output of said additional voltage adder means operatively connected to said voltage control oscillator means, wherein the frequency of said output of said voltage controlled oscillator means corresponds to the amplitude of the output of said additional voltage adder means;
   a reference oscillator means for providing an output having a predetermined fixed frequency;
   first and second frequency divider means operatively connected respectively to said output of said voltage control oscillator means and to said output of said reference oscillator means, the frequency of an output of said first frequency divider means having a predetermined relationship with the frequency of said output of said voltage controlled oscillator means and the frequency of an output of said second frequency divider means having a predetermined relationship with the frequency of said output of said reference oscillator means;
   a phase comparator means operatively connected to the outputs of said first and second frequency divider means for producing an output corresponding to the difference in phase between said outputs of said first and second frequency divider means;
   said phase comparator means operatively connected to said additional low pass filter means;
   a channel selector means and a control means operatively connected to said channel selector means, said channel selector means for manually selecting a channel to be received;
   said control means operatively connected to said first frequency divider means, said voltage integrator means, and said phase comparator means, said control means controlling said voltage integrator means to disconnect said input thereof from said voltage adder means, whereby said output of said voltage integrator means comprises a fixed amplitude voltage;
   said control means disconnecting said phase comparator means from said additional low pass filter means; and control means controlling the relationship between the frequency of said output of said first frequency divider means and the frequency of said output of said voltage controlled oscillator means in dependence upon the channel selected to be received by said channel selector means;
   wherein said channel selector operates in a phase locked loop mode for receiving input signals having a frequency corresponding to a predetermined frequency of said channel selected by said channel selector; and
   wherein said channel selector operates in an automatic frequency control mode for receiving input signals having a varying frequency close to the frequency of said channel selected by said channel selector.

8. A channel selector as in claim 7, further comprising:

a carrier detector means and a sync signal detector means, said carrier detctor means and said sync signal detector means operatively connected to said I.F. amplifier means for respectively detecting the presence or absence of a carrier signal and sync signal having predetermined characteristics present at said output of said I.F. amplifier means;

a logic operation circuit operatively connected to said carrier detector means, said sync signal detector means, and said control means, for controlling the operation of said control means in response to said outputs of said carrier detector means and said sync signal detector means.

* * * * *